United States Patent
Mattisson

(10) Patent No.: US 6,404,308 B1
(45) Date of Patent: Jun. 11, 2002

(54) PHASE-COMPENSATED IMPEDANCE CONVERTER

(75) Inventor: Sven Mattisson, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/472,363

(22) Filed: Dec. 23, 1999

(51) Int. Cl.⁷ ............................................... H03H 11/42
(52) U.S. Cl. ................................... 333/215; 331/108 B
(58) Field of Search .............................. 331/57, 108 B, 331/132, 135; 333/215; 330/63, 277

(56) References Cited

U.S. PATENT DOCUMENTS

| | | | |
|---|---|---|---|
| 3,715,693 A | | 2/1973 | Fletcher et al. ............. 333/215 |
| 3,840,829 A | * | 10/1974 | Fletcher et al. ............. 333/215 |
| 3,898,578 A | * | 8/1975 | Fletcher et al. ............. 330/63 |
| 3,931,588 A | * | 1/1976 | Gehweiler .................... 331/57 |
| 4,045,747 A | * | 8/1977 | Hsu ............................. 330/277 |
| 4,760,349 A | | 7/1988 | Park et al. ................... 330/264 |
| 4,891,609 A | * | 1/1990 | Eilley .......................... 331/57 |
| 5,357,217 A | * | 10/1994 | Marchesi et al. ............. 331/57 |
| 5,525,930 A | * | 6/1996 | Pothast et al. ............... 330/252 |
| 5,734,294 A | * | 3/1998 | Bezzam et al. .............. 327/552 |
| 5,986,502 A | * | 11/1999 | Nakamura ................... 330/258 |
| 6,025,765 A | * | 2/2000 | Brown ......................... 331/215 |
| 6,194,972 B1 | * | 2/2001 | Brown ......................... 331/108 B |

OTHER PUBLICATIONS

Fink et al., Electronics Engineers' Handbook, 4th ed. (D. Christiansen et al. eds.), pp. 16.38–16.39 McGraw–Hill, New York (1997).
Horwitz et al., P., The Art of Electronics 2d ed., pp 266–267, 281 Cambridge University Press (1989).
Nakamura, M., et al., "Hybrid IC Gyrator as Solid State Inductor", Electronic Components Conference, pp. 393–398, May 14–16, 1979.
Nauta, B., "A CMOS Transconductance–C Filter Technique for Very High Frequencies", IEEE Journal of Solid–State Circuits, vol. 27, No. 2, Feb. 1992.

* cited by examiner

*Primary Examiner*—Benny Lee
*Assistant Examiner*—Dean Takaoka
(74) *Attorney, Agent, or Firm*—Burns, Doane, Swecker & Mathis, L.L.P.

(57) ABSTRACT

Integrated circuits, for example, gyrator circuits include transistors that are preferably MOS devices and that are provided with series feedback networks, which compensate for the effects of channel delay in the MOS devices.

11 Claims, 4 Drawing Sheets

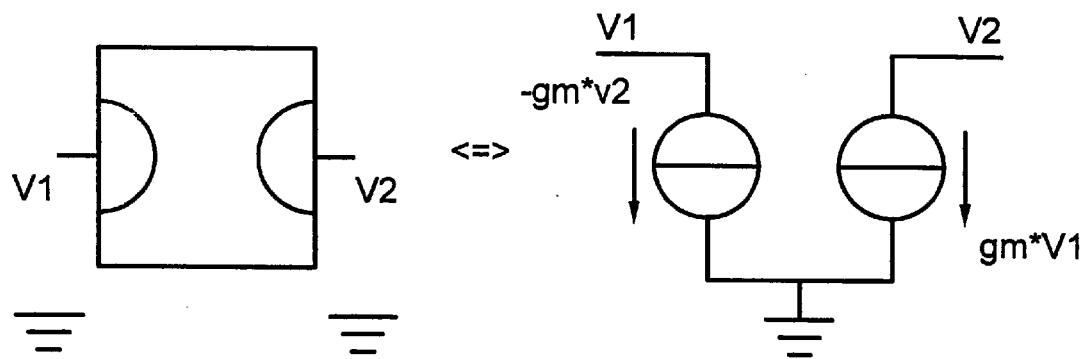
FIG. 1A
PRIOR ART
FIG. 1B
PRIOR ART
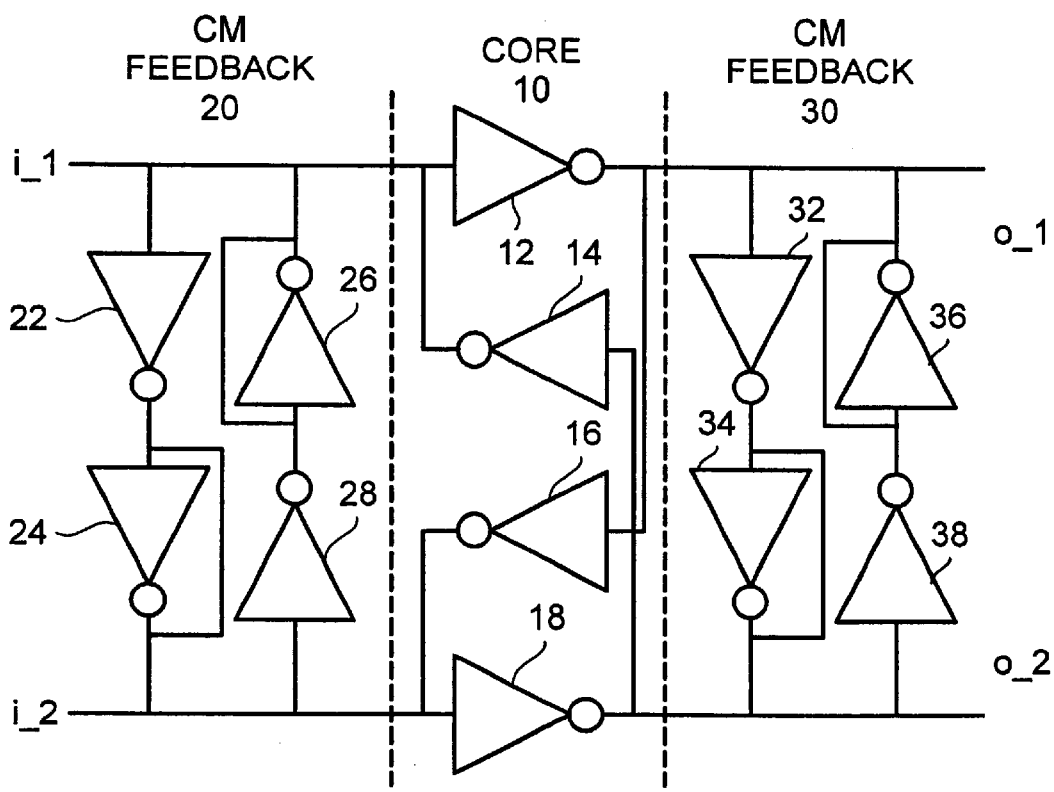
FIG. 2
PRIOR ART

PHASE-COMPENSATED IMPEDANCE CONVERTER

BACKGROUND

This invention relates to electronic impedance converter circuits and more particularly to impedance invertors, or gyrators, and even more particularly to phase-compensated gyrators and integrators.

One of the advantages of electronic integrated circuits (ICs) is small size, and so ICs have become ubiquitous in hand-held and other equipment, but some circuits require components that are difficult to integrate. In particular, it is difficult to integrate passive inductors having impedances of more than a few nanohenries (nH). Thus for example, on-chip passive signal filters are normally limited to resistor-capacitor (RC) filters, except for filters designed for very high frequencies where inductors (coils) of a few nH are effective.

In communications and electronics, a filter is generally hardware or software that selectively passes certain elements of a signal and eliminates or minimizes others. A filter in a telecommunication network, for example, may transmit signal elements either up to a certain frequency and attenuate (dampen) those above it (a low-pass filter), or down to a certain frequency and attenuate those below it (a high-pass filter), or within a band of frequencies (a band-pass filter).

It is possible to overcome the limited impedances of integrable passive inductors by using combinations of active devices (e.g., op-amps), resistors, and capacitors that are easily integrable. One combination that can mimic the properties of a passive inductor is the integrator, which can generally be considered to convert an impedance to its inverse. Integrators are often used in discrete-time (digital) filters. Continuous-time (analog) filters implemented with integrators typically employ such elements in loops and these loops are often connected back-to-back. Two integrators in a loop actually form a gyrator, and if the forward and backward integrators have the same transfer characteristics they form a passive gyrator, otherwise they form an active (or asymmetric) gyrator.

Gyrators are described in the literature, which includes P. Horowitz et al., *The Art of Electronics* 2d ed., pp. 266–267, 281 Cambridge University Press (1989); Fink et al., *Electronic Engineer's Handbook* 4th ed. (D. Christiansen et al. eds.), pp. 16.38–16.39 McGraw-Hill, New York (1997); and B. Nauta, "A CMOS Transconductance-C Filter Technique for Very High Frequencies", *IEEE J. Solid-State Circuits*, vol. 27, no.2, pp. 142–153 (February 1992). Various circuits employing gyrators and integrators are described in German Patent Application No. 199 364 30-3 filed on Aug. 3, 1999, by S. Mattisson for "Analog Filter"; and U.S. patent application Ser. No. 09/274,327 filed on Mar. 23, 1999, by S. Mattisson for "Demodulator Circuits", both of which are expressly incorporated in this application by reference.

In general, the output signal produced by a gyrator is delayed in time and is shifted in phase with respect to the input signal provided to the gyrator. As seen from FIGS. 1A, B, a gyrator generally comprises a positive transconductance $g_m$ and a negative transconductance $-g_m$ that receive input voltage signals v1, v2 and produce a combined output current signal.

Gyrators can be implemented in various circuits. For example, a gyrator can be implemented in a combination of inverter circuits as illustrated in FIG. 2, which depicts a gyrator core 10 having four invertors 12, 14, 16, 18 arranged as described in the above-cited Nauta publication. The negative transconductance is realized by employing differential input signals i_1, i_2 and differential output signals o_1, o_2 and by crossing one pair of output-to-input connections. This crossing produces a loop through the four invertors (transconductances), and it will be appreciated that although FIG. 2 shows the connection between inverter 12's output and inverter 16's input crossing the connection between inverter 18's output and inverter 14's input, it is possible for the loop to be formed by crossing the connection between the inverter 12's input and the inverter 16's output and the connection between the inverter 14's output and the inverter 18's input.

Such a filter typically may also include sections 20, 30 for feeding back common-mode voltages. As depicted in FIG. 2, section 20 has four invertors 22, 24, 26, 28 and section 30 has four invertors 32, 34, 36, 38.

Crossing connections as depicted in FIG. 2 can cause stability problems in circuits using such gyrator cores. It will be appreciated that a stability analysis of a gyrator-based filter such as that depicted in FIG. 2 is substantially the same as the stability analysis of an integrator-based filter because integrators are parts of gyrator loops. First-order stability analysis such as that described in the Nauta publication reveals that stable, i.e., non-regenerative, behavior can be obtained only if invertors are used in the gyrator core 10. For example, the transconductances, e.g., invertors 12, 14, 16, 18, may be single metal-oxide-semiconductor (MOS) transistors, including complementary MOS (CMOS) field-effect transistors (FETs). Using MOS components, and in particular CMOS components, has a number of advantages, not the least of which is low power consumption.

More detailed analysis of the MOS transistors, however, shows that non-quasi-static behavior of channel charges in each MOS device adds a delay that can be approximated by a parasitic pole in the frequency response of the transconductance of each device. This extra pole, or delay, makes the gyrator unstable if it is not designed properly. The actual performance of the simple filters described in the Nauta publication generally accords with Nauta's predictions, but the actual performance of the complicated filters described by Nauta may deviate by as much as 10 dB from the predicted behaviors.

Nauta's filters could be stabilized by separate Q-tuning circuits (e.g., a separate supply voltage for ballast invertors in common-mode feedback networks) that could be externally adjusted, but then the filter's transfer characteristic was altered significantly from that predicted because the gyrator's Q does not depend only on the output conductances of the gyrator transistors but also on the channel delay and the external resonator (loading capacitance). Lower-order filters might work because the external terminations would provide sufficient loading of the gyrators to make them stable, but higher-order filters would have internal nodes that did not get sufficient loading to make the filters stable, unless the resonance frequencies were very low compared to the transit frequencies $f_T$ of the devices in the gyrator cores or every gyrator were given a separate Q-tuning circuit, which would be impractical.

German Patent Application No. 199 580 96-0 filed on Dec. 2, 1999, by S. Mattisson for "High-Q Gyrator Structures", describes a method for enhancing the quality factor of gyrator resonators by balancing phase-lag and phase-lead terms in the gyrator structure. This works very well for parallel resonators having comparatively narrow bandwidths that emulate parallel LC resonators. Nevertheless, it is desirable for general-purpose impedance invertors to have wide bandwidths, and the job of balancing terms is complicated by the capacitances present at the gyrator terminals. In general, it is difficult completely to "absorb" those capacitances in the impedances connected to the gyrator without violating other design constraints, ultimately resulting in the gyrator's having excess phase lag. Such phase lag in a wide bandwidth gyrator manifests itself as a signal loss, with the result that the total insertion loss of the filter an become excessive. This patent application is expressly incorporated in this application by reference.

Patent Application No. 9916808.0 filed in the United Kingdom on Jul. 16, 1999, by S. Mattisson for "Integrated Circuit" describes a method of widening the useful frequency bandwidth of a filter based on Nauta gyrators or invertors by taking into account the channel delays of MOS devices. The patent describes that it is the phase lag of the gyrator-core transadmittances (see FIG. 2) that ruins the gyrator stability. Although the transadmittance $y_m$ of a MOS device is normally assumed to be purely conductive, which would result in a stable system matrix, a filter such as that depicted in FIG. 2 is often unstable in practice due to non-quasi-static channel delays. This patent application is also expressly incorporated in this application by reference.

Furthermore, Applicant believes no complex active high-frequency continuous-time on-chip MOS filter has been successfully fabricated due to the unreliability of the gyrator cell. Successful filters have been simple, limited to lower-order filters or cascades of low-order filters (with inferior sensitivity characteristics) or more complex filters at low frequencies. It is thus desirable to devise a method for phase compensating a gyrator over a wide frequency bandwidth and to provide circuits enjoying such phase compensation.

SUMMARY

Applicant's invention overcomes these limitations of the prior art and enables gyrators and similar devices to be phase compensated over a wide frequency bandwidth.

In one aspect of Applicant's invention, an integrated circuit gyrator has series feedback associated with at least some of the transistors in the gyrator, and the series feedback is provided by at least one stack of a plurality of feedback transistors that are individually sized and capacitively compensated so as to compensate effects of non-quasi-static delays of transistors in the gyrator. The gyrator may include a plurality of invertors that are arranged in a loop and that are cross-connected, and the transistors in the gyrator and the feedback transistors may be metal-oxide-semiconductor devices, bipolar semiconductor devices, or bipolar complementary metal-oxide-semiconductor devices. The stack of feedback transistors may operate according to class AB and provide phase-lead compensation.

In another aspect of Applicant's invention, an integrated circuit gyrator has series feedback associated with at least some of the semiconductor devices in the gyrator, and the series feedback is provided by at least one stack of feedback networks that are individually sized and capacitively compensated so as to compensate effects of non-quasi-static delays of semiconductor devices in the gyrator. The gyrator may include a plurality of invertors that are arranged in a loop and that are cross-connected, and the semiconductor devices in the gyrator may be metal-oxide-semiconductor devices, bipolar semiconductor devices, or bipolar complementary metal-oxide-semiconductor devices. The stack of feedback networks may include a plurality of parallel combinations of a resistor and a capacitor.

In another aspect of Applicant's invention, an electronic signal filter has a core that includes a plurality of metal-oxide-semiconductor (MOS) devices cross-connected in a loop, and series feedback stacks respectively connected to the MOS devices. Each stack includes at least two MOS devices that have parameters selected such that phase lag due to non-quasi-static channel delays of the MOS devices in the core is reduced.

BRIEF DESCRIPTION OF DRAWINGS

FIGS. 1A, 1B are schematic representations of a gyrator circuit;

FIG. 2 is a schematic circuit diagram of a gyrator circuit;

DETAILED DESCRIPTION

Applicant's invention is described in this application in a context of a gyrator having a cross-connected structure as depicted schematically by FIG. 2, but it will be understood that the invention is not generally limited to that context. For example, the analyses set forth in this description apply also to integrators and hence to filters formed from integrators. Moreover, this description assumes the use of conventional CMOS inverter ICs because they are conveniently available, but embodiments of Applicant's invention can also use other types of devices, e.g., bipolar and field-effect (unipolar) devices and bipolar-CMOS (BiCMOS) devices.

Applicant's invention builds on the realization that a conventional first-order stability analysis of a filter that assumes MOS-like devices have purely conductive transadmittances is inadequate. Some of the consequences of this realization are described in Patent Application No. 9916808.0 for "Integrated Circuit" that is cited and incorporated by reference above.

As described in that application, filters using such devices should be analyzed based on non-quasi-static channel delays, which can be approximated by the following expressions:

$$Ym = g_m s^{s \tau_{gm}} \approx \frac{gm}{1 + s \cdot \tau_{gm}} \approx g_m - s \cdot c_m,$$

where $g_m$ is the device transconductance; $C_m = 2C_{gs}/\epsilon$; $C_{gs}$ is the device gate-source capacitance; $\epsilon$ is the Elmore constant of the channel; $T_{gm} = 2/(\epsilon \omega_T)$; and $\omega_T$ is the transit angular frequency, i.e., the angular frequency when the current gain is one. This notation is conventional, as described for example in Y. P. Tsvidis, *Operation and Modeling of the MOS Transistor*, McGraw-Hill, New York (1988). Typically, $\epsilon \approx 5$.

The first approximation is a pure delay, the second approximation is a pole, and the third approximation is a zero in the right-hand half of the complex plane. The pure delay approximation is currently difficult to use in analyses as the exponential is a transcendental function. If the pole and zero time constants are substantially identical, then the other two approximations give the same phase lag, which is important for a stability analysis. The zero approximation gives $|y_m|$ a high-pass amplitude characteristic, and the pole approximation gives $|y_m|$ a low-pass amplitude characteristic. It is currently believed that the pole approximation is more realistic, and thus the pole approximation is used in the analyses described here.

Figure 3A:
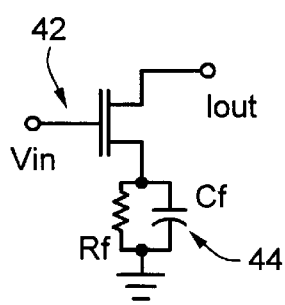
FIGS. 3A, 3B are schematic circuit diagrams showing series feedback networks.

As explained in Patent Application No. 9916808.0, each MOS device in a gyrator core can advantageously be provided with series feedback. FIG. 3A shows a transistor 42 and a feedback network 44 that includes a parallel combination of a feedback resistor Rf having a resistance $r_f$ and a feedback capacitor Cf having a capacitance $c_f$. The feedback network 44 is connected in series with the source terminal of the transistor 42 and has an impedance given by $z_f = r_f || c_f = r_f / (1 + s \cdot T_f)$.

Figure 3B:
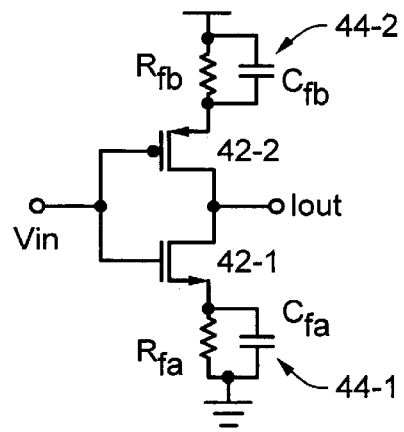

It will be appreciated that the transistor 42 Is depicted in FIG. 3A as a single transistor for convenience and generally represents an integrator circuit. FIG. 3B depicts the arrangement as a pair of CMOS devices 42-1, 42-2, each of which is provided with a respective feedback network 44-1, 44-2. Feedback network 44-1 includes a parallel combination of a feedback resistor $R_{fa}$ having a resistance $r_{fa}$ and a feedback capacitor $C_{fa}$ having a capacitance $c_{fa}$. Similarly, feedback network 44-2 includes a parallel combination of a feedback resistor $R_{fb}$ having a resistance $r_{fb}$ and a feedback capacitor $C_{fb}$ having a capacitance $c_{fb}$. At one extreme, one could have feedback resistances $r_{fa} = r_{fb} = 0$. Those of ordinary skill in this art will understand that In general it is not necessary for both feedback resistances $r_{fa}$, $r_{fb}$ to have the same value or for both feedback capacitances $c_{fa}$, $c_{fb}$ to have the same value. These values can be selected so as to tune or otherwise shape the frequency response of the devices and circuits in which they are included.

Using the pole approximation and adding series feedback to a MOS transistor by a source-terminal series impedance as depicted in FIGS. 3A, 3B, one can determine that the closed-loop transfer admittance $G_T$ of a gyrator is given by:

$$G_t = \frac{y_m}{1 + y_m \cdot z_f} = \frac{\dfrac{g_m}{1 + s \cdot \tau_{gm}}}{1 + \dfrac{g_m}{1 + s \cdot \tau_{gm}} \dfrac{r_f}{1 + s \cdot \tau_f}}$$

$$= \frac{g_m}{1 + g_m r_f} \cdot \frac{1 + s \cdot \tau_f}{1 + s \dfrac{\tau_{gm} + \tau_f}{1 + g_m r_f} + s^2 \dfrac{\tau_{gm} \tau_f}{1 + g_m r_f}}$$

In the limit of $g_m \gg r_f$, it can be seen that $G_T \approx 1/z_f$ for low frequencies, which is to say that $G_T$ has a first pole in the left-hand half of the complex plane, giving an initial phase advance when series feedback is provided. Since a phase lag occurs without feedback, one can employ series feedback to find a balance condition in which the phase lag can be minimized below a certain frequency.

Figure 4:
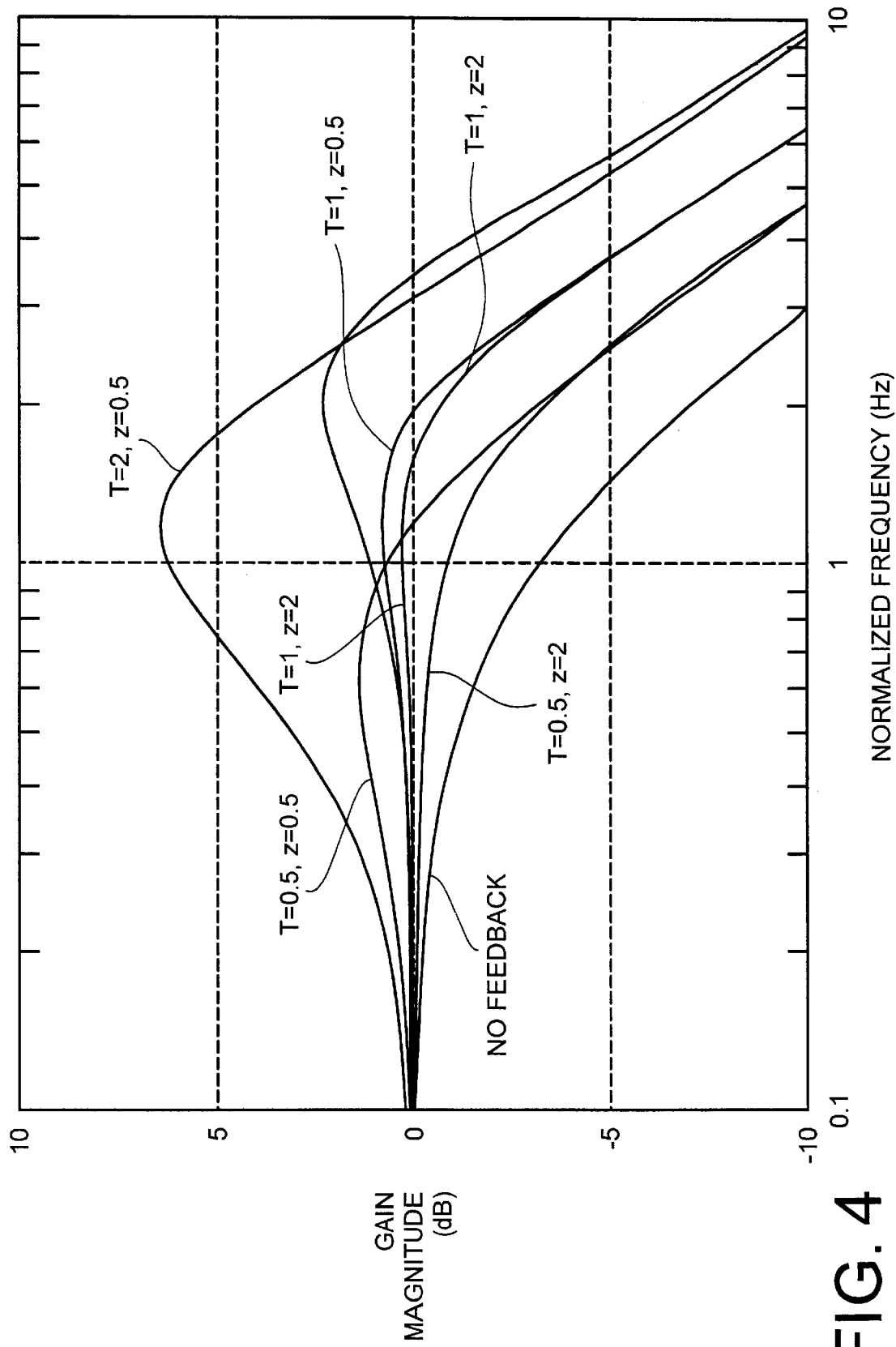
FIG. 4 shows plots of the normalized magnitude of a transfer admittance $G_T$.
Figure 5:
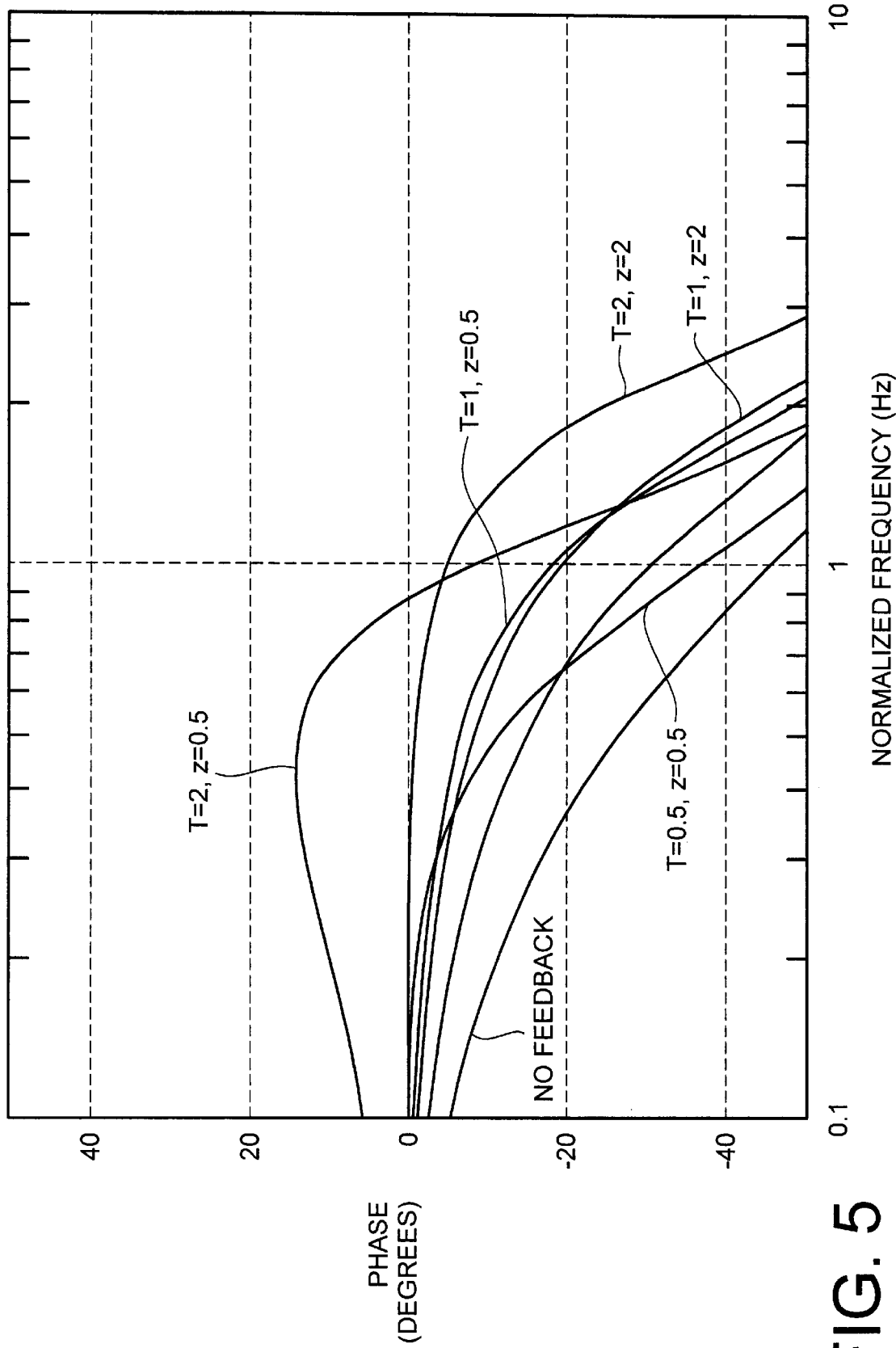
FIG. 5 shows plots of the normalized phase of a transfer admittance $G_T$.

FIG. 4 shows plots of the normalized magnitude of the transfer admittance $G_T$ and FIG. 5 shows plots of the normalized phase of $G_T$ according to the preceding expression for various values of the parameters $T = g_m r_f$ and $z = 1/T_f$. These plots show that a moderate loop gain can give a substantial widening of the transadmittance bandwidth and also yield some phase lead should that be desirable, e.g., to compensate for parasitic-induced phase lag.

Figure 6A:
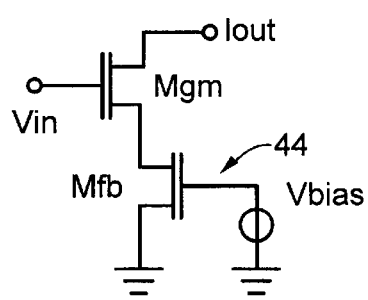
FIGS. 6A, 6B are schematic circuit diagrams of other series feedback networks.
Figure 6B:
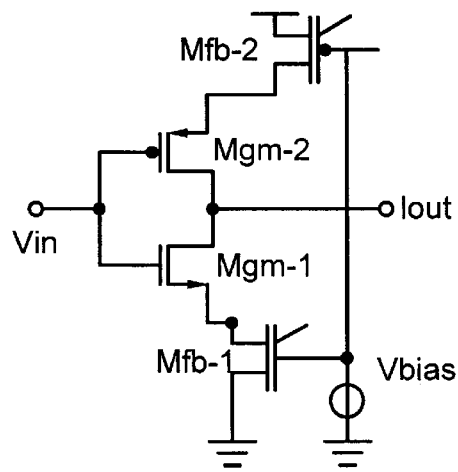

In practical applications of these analyses, it is currently believed to be important for the characteristic parameters (here, $g_m$, $r_f$, $T_{gm}$, and $T_f$) to track each other, viz., maintain a substantially constant relationship, over production, temperature and supply voltage variations. In an integrated circuit, this can be accomplished by using as the feedback network 44 a MOS device operating in the triode region. Such an arrangement is depicted in FIG. 6A, where the network 44 is shown as a MOS device Mfb that is suitably biassed by a voltage source Vbias connected to its gate and that is connected in series with a gyrator transconductor represented pictorially by a MOS device Mgm. As in FIG. 3A, it will be appreciated that the device Mgm is depicted in FIG. 6A as a single transistor and generally represents an integrator circuit. FIG. 6B depicts the arrangement as a pair of CMOS devices Mgm-1, Mgm-2, each of which is provided with a respective MOS feedback network Mfb-1, Mfb-2 of the appropriate MOS channel. With such MOS feedback networks, $r_f = 1/g_d$ and $c_f = c_{gd}$, where $g_d$ is the output conductance of the device/network Mfb and $c_{gd}$ is the gate-drain capacitance of the device/network Mfb.

It is also advantageous for the bias voltage Vbias to track variations in the supply voltage provided to the gyrator since a gyrator core as described in the Nauta publication is tuned by its supply voltage. If the bias voltage Vbias tracks the cell tuning voltage, then $r_f \, 1/g_m$ and $T_f \, T_{gm}$ are assured over normal process, temperature, and supply voltage variations.

Although series feedback networks like those depicted in FIGS. 3 and 6 can provide phase compensation to a gyrator cell, the resulting gyrator has a lower compression point than an uncompensated Nauta gyrator. The compression point is lowered because the series feedback networks shown operate in class A, and thus they leave the linear region when the input-signal magnitude approaches the voltage drop across the feedback resistor Rf or the feedback MOS device Mfb. The uncompensated gyrator cell operates in class AB and is linear over a much wider input-voltage range. Thus, the networks of FIGS. 3A, 3B, 6A, and 6B improve the small-signal problem but worsen the large signal performance.

Figure 7A:
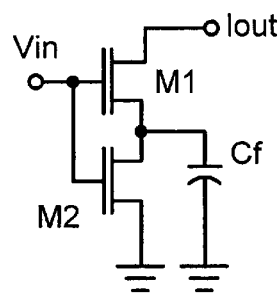
FIG. 7A is a schematic diagram of a series feedback network having split MOS devices.
Figure 7B:
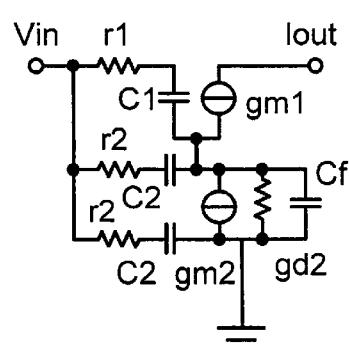
FIG. 7B is a small-signal model of the series feedback network of FIG. 7A.

Applicant has found that this tradeoff can be avoided by splitting the feedback MOS device into a plurality of sections, e.g., two halves M1 and M2 as depicted in FIG. 7A, and providing a compensation capacitor Cf, also as depicted in FIG. 7A, thereby creating a phantom zero in the response that exhibits small-signal behavior similar to that exhibited by gyrators having the networks depicted in FIGS. 3 and 6. The feedback network depicted in FIG. 7A can be modeled as shown in FIG. 7B, where gm1 is the transconductance and c1 is the gate-source capacitance of device M1 and r1 is the resistance in series with c1; and similarly gm2 is the transconductance, c2 is the gate-source capacitance, and gd2 is the output conductance of device M2, and r2 is the resistance in series with c2. It will be understood that FIG. 7B shows two of r2 and c2 because in the triode region, the gate-source capacitance c2 of device M2 is approximately the same as the gate-drain capacitance of device M2 and the resistances in series with those capacitances are also approximately the same.

A simplified expression for the transfer-admittance $G_T$ of a series-compensated gyrator as shown in FIG. 7A and modeled by FIG. 7B is the following:

$$G_T \approx g_{d2} \frac{1 + s \cdot \dfrac{c_f}{g_{d2}}}{1 + s \dfrac{c_f}{g_{m1}} + 2s^2 c_2 c_f r_2}$$

where quantities depicted in FIG. 7B are shown with subscripts and, without loss of generality, it is assumed that $g_{m1} \gg g_{d2} \gg g_{m1}$. It will be appreciated that this expression is structurally similar to the previous expression for $G_T$, and by properly sizing M1, M2, and Cf, it is possible to obtain transfer function plots similar to those of FIGS. 4 and 5. Some typical values of these parameters for device M1 are $g_m \approx 50$ microsiemens ($\mu$S); $g_d \approx 50$ nanosiemens (nS); $r_f \approx 20$ kilohm (k$\Omega$); and $c_f \approx 1$ picofarad (pF), with capacitances in the saturation region of $c_{gs} \approx 1$ pF and $c_{gd} \approx 30$ pF and capacitances in the triode region of $c_{gs} \approx 0.75$ pF and $c_{gd} \approx 0.75$ pF. It will be appreciated, of course, that Applicant's invention is not limited to devices having such values.

At low frequencies, the compensation capacitor Cf does not alter the transfer function (frequency response) significantly. Thus, the large-signal behavior is substantially the same as that of an uncompensated transadmittance, i.e., class AB. At high frequencies, the capacitor Cf acts substantially as a short circuit, so only device M1 is active as a gain element and since M1's source terminal is substantially grounded, device M1 operates in class AB. Once again, the large-signal behavior is substantially the same as that of an uncompensated transadmittance.

Stacking transistors as depicted in FIG. 7A thus combines the advantageous small-signal properties of a series-feedback network and the advantageous large-signal properties of a non-series-feedback structure. Moreover, if only one type, e.g., MOS, is used for all stacked devices, the device parameters will be subject to the same process and environmental variations and the parameters of M1 and M2 will track. For that reason, the type of stacked device (e.g., MOS) is also preferably the same as the type of the devices in the gyrator core, although at least in principle one can imagine mixing types.

It will be noted that it is possible to stack more than the two devices depicted in FIG. 7A and that it is possible to stagger devices having different MOS channel types, viz., PMOS devices and NMOS devices can alternate in a stack. Doing so can have advantages in various applications. For example, stacking more than two devices and/or staggering device types enables staggering time constants respectively attributable to the stacked devices, thereby facilitating even further widening or other shaping of the circuit's frequency response.

The compensation capacitor Cf can be implemented by a capacitor externally connected to the IC, or preferably by another MOS gate or device, which would result in better matching. It will be noted that the compensation capacitor Cf is connected in parallel with the source/drain to bulk parasitic diode capacitances. Just as more than two devices can be stacked, the compensation capacitor Cf can be implemented as a plurality of capacitors that may have different respective capacitances and be connected across respective ones of the stacked devices M1, M2, . . . . Such stacked capacitors could be selected so as to ground stacked devices at different frequencies, also enabling the circuit's frequency response to be selectively shaped.

Applicant's invention is described above with reference to particular embodiments, and it will be readily apparent to those skilled in the art that it is possible to embody the invention in forms other than those described above. The particular embodiments described above are merely illustrative and should not be considered restrictive in any way. The scope of the invention is determined by the following claims, and all variations and equivalents that fall within the range of the claims are intended to be embraced therein.

What is claimed is:

1. An integrated circuit gyrator, having series feedback associated with at least some of the transistors therein, wherein the series feedback is provided by at least one stack of a plurality of feedback transistors that are individually sized and capacitively compensated so as to compensate effects of non-quasi-static delays of transistors in the gyrator.

2. The integrated circuit gyrator of claim 1, wherein the gyrator comprises a plurality of invertors that are arranged in a loop and that are cross-connected.

3. The integrated circuit gyrator of claim 1, wherein the transistors in the gyrator and the feedback transistors are metal-oxide-semiconductor devices.

4. The integrated circuit gyrator of claim 1, wherein the transistors in the gyrator and the feedback transistors are bipolar semiconductor devices.

5. The integrated circuit gyrator of claim 1, wherein the transistors in the gyrator and the feedback transistors are bipolar complementary metal-oxide-semiconductor devices.

6. The integrated circuit gyrator of claim 1, wherein the stack of feedback transistors operate according to class AB and provide phase-lead compensation.

7. An integrated circuit gyrator, having series feedback associated with at least some of the semiconductor devices therein, wherein the series feedback is provided by at least one stack of feedback networks that are individually sized and capacitively compensated so as to compensate effects of non-quasi-static delays of semiconductor devices in the gyrator.

8. The integrated circuit gyrator of claim 7, wherein the gyrator comprises a plurality of invertors that are arranged in a loop and that are cross-connected.

9. The integrated circuit gyrator of claim 7, wherein the semiconductor devices in the gyrator are ones of metal-oxide-semiconductor devices, bipolar semiconductor devices, and bipolar complementary metal-oxide-semiconductor devices.

10. The integrated circuit gyrator of claim 7, wherein the stack of feedback networks includes a plurality of parallel combinations of a resistor and a capacitor.

11. An electronic signal filter, comprising a core that includes a plurality of metal-oxide-semiconductor (MOS) devices cross-connected in a loop, and series feedback stacks respectively connected to the MOS devices, wherein each stack includes at least two MOS devices that have parameters selected such that phase lag due to non-quasi-static channel delays of the MOS devices in the core is reduced.

* * * * *